United States Patent
Liang

(10) Patent No.: US 9,647,012 B1
(45) Date of Patent: May 9, 2017

(54) TFT ARRAY SUBSTRATE AND MANUFACTURING METHOD THEREOF

(71) Applicant: Wuhan China Star Optoelectronics Technology Co., Ltd., Wuhan, Hubei (CN)

(72) Inventor: Bo Liang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/161,260

(22) Filed: May 22, 2016

(30) Foreign Application Priority Data

Jan. 26, 2016 (CN) .......................... 2016 1 00516457

(51) Int. Cl.
| | |
|---|---|
| *H01L 27/12* | (2006.01) |
| *H01L 29/786* | (2006.01) |
| *H01L 29/66* | (2006.01) |
| *H01L 29/417* | (2006.01) |
| *H01L 29/423* | (2006.01) |

(52) U.S. Cl.
CPC ........ *H01L 27/127* (2013.01); *H01L 27/1225* (2013.01); *H01L 29/41733* (2013.01); *H01L 29/42384* (2013.01); *H01L 29/66742* (2013.01); *H01L 29/78681* (2013.01); *H01L 29/78696* (2013.01)

(58) Field of Classification Search
CPC .................................................... H01L 27/127
See application file for complete search history.

(56) References Cited

U.S. PATENT DOCUMENTS

| | | | | |
|---|---|---|---|---|
| 6,528,171 B1* | 3/2003 | Endler | .................. | C23C 16/14 407/119 |
| 2003/0193296 A1* | 10/2003 | Russ | ...................... | H01J 3/021 315/169.3 |
| 2008/0061346 A1* | 3/2008 | Tang | .................... | H01L 27/108 257/314 |
| 2012/0164408 A1* | 6/2012 | Hwu | ........................ | B32B 7/06 428/202 |

(Continued)

OTHER PUBLICATIONS

Th. Weber, Basic Reaction Steps in the Sulfidation of Crystalline MoO3 to MoS2, As Studied by X-ray Photoelectron and Infrared Emission Spectroscopy, J. Phys. Chem. 1996, 100, 14144-14150.*

*Primary Examiner* — Calvin Choi
*Assistant Examiner* — S. M. S Imtiaz
(74) *Attorney, Agent, or Firm* — Andrew C. Cheng

(57) ABSTRACT

The present disclosure provides a TFT array substrate and manufacturing method thereof, forming a class structure of graphene-like two-dimensional layered semiconductor material on a base substrate and transferring the class structure of graphene-like two-dimensional layered semiconductor material on the designated position of the soft substrate to be a semiconductor active layer of the array substrate, therefore the semiconductor active layer of the TFT array substrate of the present disclosure uses a class structure of graphene-like two-dimensional layered semiconductor material to makes the array substrate having the advantage of higher electron mobility and mechanical property, excellent flexural resistance and reducing thickness of the substrate greatly.

9 Claims, 5 Drawing Sheets

(56) References Cited

U.S. PATENT DOCUMENTS

| | | | |
|---|---|---|---|
| 2013/0249147 A1* | 9/2013 | Bedworth | C01B 31/0484 264/483 |
| 2013/0256629 A1* | 10/2013 | Lee | H01L 27/283 257/13 |
| 2014/0077160 A1* | 3/2014 | Dai | H01L 27/3262 257/29 |
| 2014/0077161 A1* | 3/2014 | Duan | B82Y 10/00 257/29 |
| 2014/0146011 A1* | 5/2014 | Huang | G06F 3/0412 345/174 |
| 2014/0154770 A1* | 6/2014 | Vittadello | C01B 31/043 435/177 |
| 2014/0299838 A1* | 10/2014 | Lee | H01L 29/66431 257/27 |
| 2015/0122320 A1* | 5/2015 | Wu | H01L 21/02376 136/256 |
| 2015/0255661 A1* | 9/2015 | Liang | H01L 31/18 438/95 |
| 2015/0318401 A1* | 11/2015 | Duan | H01L 29/66742 250/200 |
| 2016/0043074 A1* | 2/2016 | Hurley | H01L 21/8258 257/351 |
| 2016/0240598 A1* | 8/2016 | You | H01L 27/3258 |

* cited by examiner

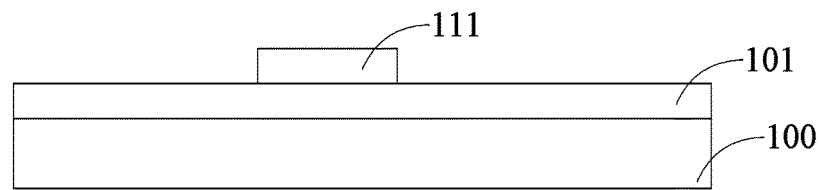
FIG. 3
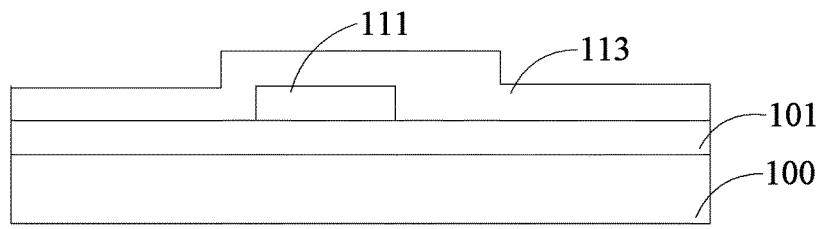
FIG. 4
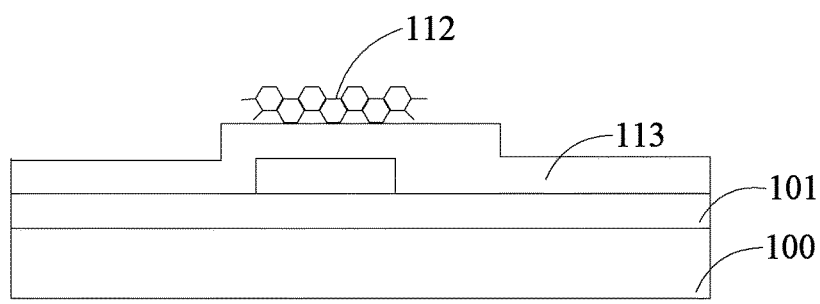
FIG. 5
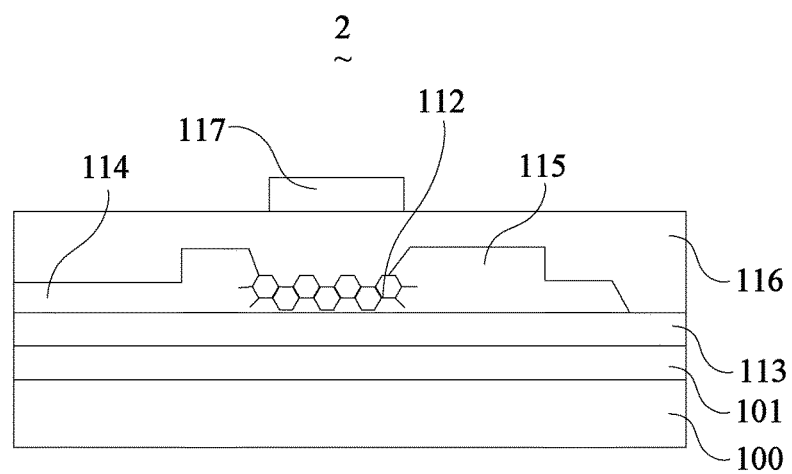

Forming a second gate on the second insulating layer

FIG. 7

TFT ARRAY SUBSTRATE AND MANUFACTURING METHOD THEREOF

FIELD OF THE DISCLOSURE

The present disclosure relates to a flat panel display technology, and more particularly to a TFT array substrate and manufacturing method thereof.

BACKGROUND OF THE DISCLOSURE

In the prior art of flat panel display, an amorphous Silicon (a-Si), a low temperature poly-Silicon (LTPS) or an amorphous Indium Gallium Zinc Oxide (IGZO) is used to drive thin film transistors (TFTs) as a semiconductor active layer. Electron mobility of the a-Si is lower than 1 cm$^2$/V$^{-1}$ s$^{-1}$ and limits display area and speed of logic control. Although electron mobility of the LTPS is higher, the leakage current is big and is affecting touch accuracy and touch operation experience. Although leakage current of the amorphous IGZO is smaller, the amorphous IGZO is very sensitive to water, oxygen and light and is affecting the life. More importantly, after bending and folding several times, the amorphous semiconductor material and the polycrystalline semiconductor material of the above several arts used to the soft display substrate is very prone to cracking phenomenon, so that the display will appear spots, black lines, bright lines, etc.

SUMMARY OF THE DISCLOSURE

In view of this, the present disclosure provides a TFT array substrate and manufacturing method thereof, the array substrate has the advantage of higher electron mobility and mechanical property, excellent flexural resistance and reducing thickness of the substrate.

One aspect of the present disclosure provides a manufacturing method of the TFT array substrate, the manufacturing method includes:

providing a hard substrate;

providing a soft substrate, the soft substrate is arranged on the hard substrate;

a first insulating layer is formed on the soft substrate, and preset a designated position on the first insulating layer;

providing a base substrate;

a class structure of graphene-like two-dimensional layered semiconductor material is formed on the base substrate, the class structure of graphene-like two-dimensional layered semiconductor material is MoS$_2$, MoSe$_2$, WS$_2$, WSe$_2$ or SnS$_2$;

transferring the two-dimensional layered semiconductor material on the designated position;

hydrotreating the two-dimensional layered semiconductor material to form a semiconductor active layer.

Further, a specific material of two-dimensional layered semiconductor is MoS$_2$, specific steps of the class structure of graphene-like two-dimensional layered semiconductor material formed on the base substrate includes:

forming a Mo pattern on the base substrate, the position of the Mo pattern is corresponding to the designated location;

using MoO$_3$ and material S at a temperature between 600° C. to 800° C. to form a two-dimensional layered MoS$_2$ on the Mo pattern by chemical vapor deposition.

Further, a plane formed by Mo atom in same layer of the two-dimensional layered MoS$_2$ is parallel with the soft substrate.

Further, thickness of the monolayer two-dimensional layered MoS$_2$ is 0.62 nm to 0.72 nm.

Further, after the step of providing a soft substrate and before the step of forming a first insulating layer on the soft substrate, further includes:

a first gate electrode is formed on the soft substrate, wherein the first insulating layer covers the first gate electrode and protrudes on the soft substrate, the position of the first gate electrode is corresponding to the designated position.

Further, after the step of hydrotreating the two-dimensional layered semiconductor material to form a semiconductor active layer, further includes:

a source electrode and a drain electrode are further formed on the first insulating layer by mask process, the source electrode and the drain electrode are arranged at intervals by the semiconductor active layer, the source electrode and the drain electrode contact the semiconductor active layer respectively.

Further, after the step of hydrotreating the two-dimensional layered semiconductor material to form a semiconductor active layer, further includes:

a source electrode and a drain electrode are further formed on the first insulating layer by mask process, the source electrode and the drain electrode are arranged at intervals by the semiconductor active layer and the source electrode and the drain electrode contact the semiconductor active layer respectively;

arranging a second insulating layer on the source electrode, the drain electrode and the semiconductor active layer;

forming a second gate electrode on the second insulating layer, the position of the second gate electrode corresponds to the position of the semiconductor active layer.

another aspect of the present disclosure provides a manufacturing method of TFT array substrate, the manufacturing method includes:

a hard substrate;

a soft substrate, the soft substrate is arranged on the hard substrate;

a first insulating layer, the first insulating layer is arranged on the soft substrate;

a semiconductor active layer, the semiconductor active layer is arranged on a pre-specified location of the first insulating layer, the semiconductor active layer is a class structure of graphene-like two-dimensional layered semiconductor material, further the class structure of graphene-like two-dimensional layered semiconductor material is MoS$_2$, MoSe$_2$, WS$_2$, WSe$_2$ or SnS$_2$.

The array substrate further includes:

a first gate electrode, the first gate electrode is arranged between the soft substrate and the first insulating layer, the first gate electrode corresponds to the semiconductor active layer;

a source electrode and a drain electrode, the source electrode and the drain electrode are arranged at intervals on the first insulating layer by the semiconductor active layer, and the source electrode and the drain electrode contact the semiconductor active layer respectively.

The array substrate further includes:

a source electrode and a drain electrode, the source electrode and the drain electrode are arranged at intervals on the first insulating layer by the semiconductor active layer, and the source electrode and the drain electrode contact the semiconductor active layer respectively;

a second insulating layer, the second insulating layer covers on the semiconductor active layer, the source electrode and the drain electrode;

a second gate electrode, the second gate electrode is arranged on the second insulating layer, and the position of the second gate electrode corresponds to the position of the semiconductor active layer.

By the above scheme, the beneficial effects of the present disclosure is that: different from the prior art, the TFT array substrate of the present disclosure includes a soft substrate, a semiconductor active layer formed by transferring class structure of graphene-like two-dimensional layered semiconductor material on the designated position of the soft substrate, and the TFT array substrate of the present disclosure has the advantage of higher electron mobility and mechanical property, excellent flexural resistance and reducing thickness of the substrate greatly.

BRIEF DESCRIPTION OF THE DRAWINGS

In order to illustrate example embodiment of the present disclosure clearly, the technical solution, embodiments will be described in the following figures for example need to use brief Apparently, the drawings in the following description are only some of the disclosure embodiments, those of ordinary skill in speaking, in the premise without creative efforts can also obtain other drawings according to these drawings. Further:

FIG. 3 is a schematic diagram of a first gate electrode to form the TFT array substrate in FIG. 1;

FIG. 4 is a schematic diagram of a first insulating layer to forms the TFT array substrate in FIG. 1;

FIG. 5 is a schematic diagram of a semiconductor active layer to forms the TFT array substrate in FIG. 1;

FIG. 7 is a flow diagram of manufacturing method of the TFT array substrate in FIG. 6.

DETAILED DESCRIPTION OF PREFERRED EMBODIMENTS

Hereinafter, the present disclosure in conjunction with the accompanying drawings which illustrate, were clearly the technical solution of the embodiment of the present disclosure, fully described, obviously, the described embodiments are merely part of embodiments of the present disclosure, but not all embodiments cases. Based on the embodiments of the present disclosure, all other embodiments to those of ordinary skill in the premise of no creative efforts obtained, are within the scope of protection of the present disclosure.

Figure 1:
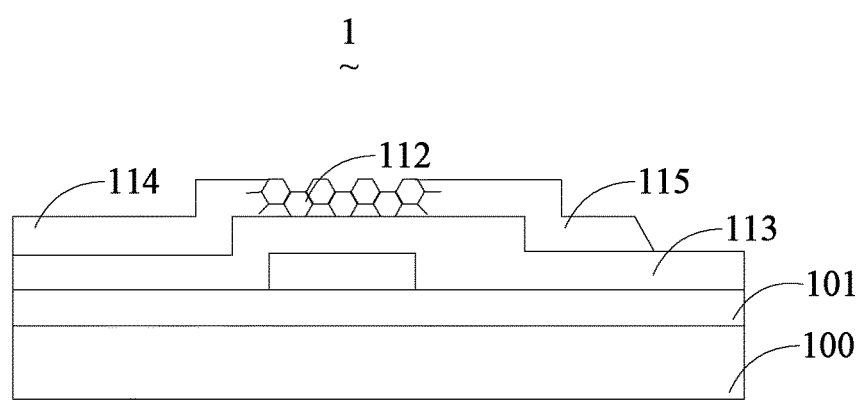
FIG. 1 is a schematic structural view of a TFT array substrate of the first embodiment of the present disclosure first embodiment.

Refer to FIG. 1, FIG. 1 is a schematic structural view of a TFT array substrate of the first embodiment of the present disclosure. As shown in FIG. 1, a TFT array substrate 1 of the present embodiment includes a hard substrate 100 and a soft substrate 101 arranged on the hard substrate 100. A first gate electrode 111 is arranged on the soft substrate 101, and a first insulating layer 113 covers the first gate electrode 111 and protrudes on the soft substrate 101. A semiconductor active layer 112 is arranged on the first insulating 113 and the semiconductor active layer 112 corresponds to the position of the first gate electrode 111, the semiconductor active layer 112 is a class structure of graphene-like two-dimensional layered semiconductor material, further the class structure of graphene-like two-dimensional layered semiconductor material is $MoS_2$, $MoSe_2$, $WS_2$, $WSe_2$ or $SnS_2$. Preferably, material of the semiconductor active layer 112 is $MoS_2$. Moreover, both sides of the semiconductor active layer 112 are further arranged a source electrode 114 and a drain electrode 115 respectively, the source electrode and the drain electrode are arranged at intervals on the first insulating layer 113 by the semiconductor active layer 112, and the source electrode 114 and the drain electrode 115 contact the semiconductor active layer 112 respectively.

Figure 2:
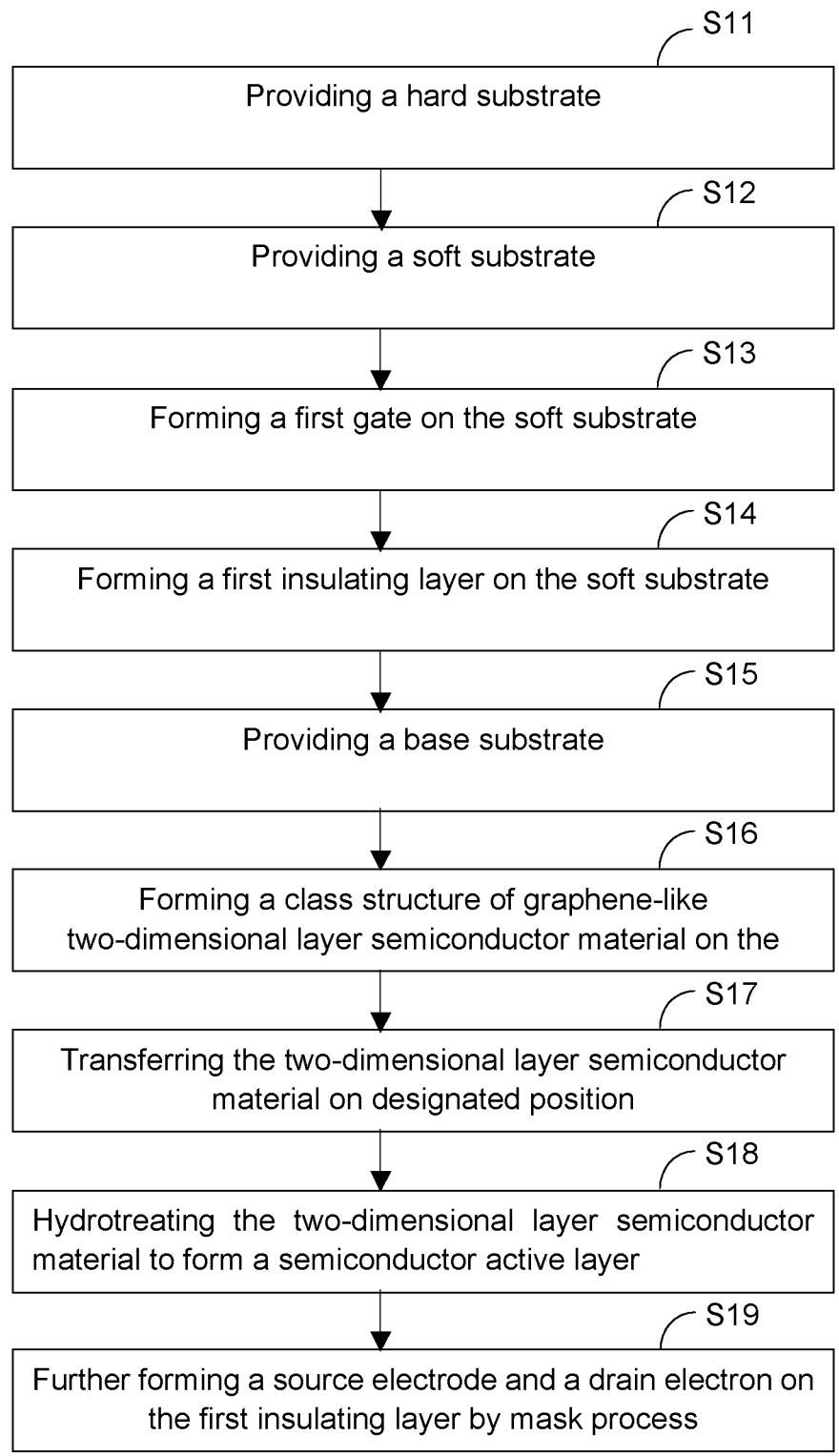
FIG. 2 is a flow diagram of a manufacturing method of the TFT array substrate in FIG. 1.

In conjunction with FIG. 1 and FIG. 3 to FIG. 5 and referring to FIG. 2, the manufacturing method of a TFT array substrate of the present embodiment includes:

S11: providing a hard substrate 100.

The hard substrate 100 may be used but not limited to glass, silicon wafers, quartz plate, sheet metal, silicon carbide wafers.

S12: providing a soft substrate 101.

The soft substrate 101 is arranged on the hard substrate 100, the soft substrate 101 may be used polyimide (PI), polyetherimide (PEI), polyphenylene sulfide (PPS), polyarylate (PAR) one or a combination thereof, it can be the fiber reinforced compound of the above to be the soft substrate 101.

S13: forming a first gate electrode 111 on the soft substrate 101.

The first gate electrode 111 is formed on the designated position on the soft substrate 101, as shown in FIG. 3, the first gate electrode 111 is formed by a prior art of metal, conductive oxide or graphene-like used in a semiconductor device. Moreover, a gate line is formed on the soft substrate 101 (not shown).

S14: forming a first insulating layer 113 on the soft substrate 101.

The first insulating layer 113 is formed on the first gate electrode 111 and the soft substrate 101, as shown in FIG. 4, the first insulating layer 113 covers the first gate electrode 111 and protrudes on the soft substrate 101. The first insulating layer 113 can be formed by silicon oxide, silicon nitride, silicon oxynitride, aluminum oxide, hafnium oxide, titanium oxide or an organic polymeric material, and can be formed by two or more material of above also. Thickness of the first insulating layer 113 is 10 nm to 50 nm.

Moreover, preset a designated position on the first insulating layer 113, the designated position corresponds to the position of the first gate electrode 111, the designated position is used for forming a semiconductor active layer 112, it will be set forth in the description which follows.

S15: providing a base substrate.

S16: a class structure of graphene-like two-dimensional layered semiconductor material is formed on the base substrate.

The base substrate can be a hard substrate or a soft substrate, such as refractory metal sheet, this is not restricted.

The class structure of graphene-like two-dimensional layered semiconductor material is $MoS_2$ (molybdenum disulfide), $MoSe_2$ (molybdenum selenide), $WS_2$ (molybdenum sulfide), $WSe_2$ (selenide) or $SnS_2$ (sulfide).

In the present embodiment, $MoS_2$ as an example, $MoS_2$ is a class structure of graphene-like two-dimensional layered semiconductor material, its electron mobility is exceed 200 $cm^2/V^{-1} s^{-1}$, switching current is higher than $10^8$, atoms in the layer of $MoS_2$ is bonded by covalent, mechanical strength is 30 times higher than steel, and has very high mechanical property and excellent flexural resistance. Thickness of the single layer $MoS_2$ is 0.62 nm to 0.72 nm, in the present embodiment, preferably thickness of the single two-dimensional layered $MoS_2$ is 0.65 nm.

A Mo (molybdenum) pattern is formed on the base substrate, the position of the Mo pattern on the base substrate corresponds to the designated position of the first insulating layer 113 on the soft substrate 101. Using the Mo in the Mo pattern as a catalyst, and chemical vapor depositing on a high temperature resistant base substrate by $MoO_3$ (molybdenum trioxide) and S (sulfur), the temperature of the chemical vapor deposition is between 600° C. to 800° C., and can formed a two-dimensional layered $MoS_2$ on the position of the Mo pattern of the base substrate by catalytic growth. A single-layer $MoS_2$ or a double-layered $MoS_2$ can be formed by deposition time control, further the double-layer $MoS_2$ deposition time is twice the single-layer $MoS_2$ deposition time. A monocrystalline or a polycrystalline $MoS_2$ can be formed by temperature control, the polycrystalline $MoS_2$ is formed at a temperature about 600° C. or lower, the monocrystalline $MoS_2$ is formed at a temperature about 800° C. or higher. Preferably, $MoS_2$ of the present disclosure is single-crystal monolayer structure.

In other embodiment, $WS_2$ as an example, a W (wolfram) pattern is formed on the base substrate and a $WS_2$ is formed by chemical vapor deposition used the W as a catalyst.

S17: transferring the two-dimensional layered semiconductor material on the designated position.

S18: hydrotreating the two-dimensional layered semiconductor material to form a semiconductor active layer 112.

The present embodiment is transferring the $MoS_2$ on the designated position and hydrotreating the $MoS_2$ to form the semiconductor active layer 112 on the designated position of the first insulating layer 113, as shown in FIG. 5. Preferably, material of the semiconductor active layer 112 is $MoS_2$, for protecting mechanical property of the array substrate, a plane formed by the Mo atom in same layer of the two-dimensional layered $MoS_2$ is parallel with the soft substrate 101.

Forming a class structure of graphene-like two-dimensional layered semiconductor material on the base substrate and transferring the class structure of graphene-like two-dimensional layered semiconductor material on the soft substrate 101 to form a semiconductor active layer 112 are decided by features of the soft substrate 101. Because of requirements of the soft substrate 101 is more, such as water blocking oxide, flexible, resistance of Excimer Laser Annealing (ELA) temperature, coefficient of thermal expansion close to the metal and the insulating layer, low surface roughness, warpage is mall, etc., temperature performance of the material of the soft substrate 101 produced corresponding to requirements is poor. Require to formed a class structure of graphene-like two-dimensional layered semiconductor material on an additional base substrate first, further formed a semiconductor active layer 112 on the soft substrate 101 by transferring the class structure of graphene-like two-dimensional layered semiconductor material.

Here we emphasize that when the class structure of graphene-like two-dimensional layered semiconductor material is forming on the base substrate, required defining the position of the class structure of graphene-like two-dimensional layer semiconductor material on the base substrate corresponding to the default designated position of the first insulating layer 113 on the soft substrate 101 is for the class structure of graphene-like two-dimensional layered semiconductor material transfers on the designated position accurately. The process can defines the position of Mo pattern on the base substrate when the Mo pattern forming on the base substrate, the position of the Mo pattern on the base substrate is corresponds to the default designated position on the first insulating layer 113, i.e. the position of the Mo pattern on the base substrate is corresponds to the position of the required semiconductor active layer 112 on the TFT array substrate and is forming the $MoS_2$ on the position of the Mo pattern when chemical vapor deposition. Marks corresponding markers on the base substrate and the soft substrate 101 before transferring, and transfers accurately by the corresponding markers. Further, the $MoS_2$ on the base substrate can be transferred on the soft substrate 101 by sheet-to-sheet (rigidity) or roll-to-sheet (flex), and can be transferred many times, i.e. $MoS_2$ can be used in larger area by multiple transfer when area of the soft substrate 101 is bigger and area of the base substrate is smaller.

S19: further forming a source electrode 114 and a drain electrode 115 on the first insulating layer 113 by mask process.

A source electrode 114 and a drain electrode 115 are formed on the first insulating layer 113 by mask process, the source electrode 114 and the drain electrode 115 are arranged at intervals by the semiconductor active layer 112, and the source electrode 114 and the drain electrode 115 contact the semiconductor active layer 112 respectively, as shown in FIG. 1.

The source electrode 114 and the drain electrode 115 can be one or more combination of metallic materials formed the ohmic contact with the $MoS_2$. Or forming the ohmic contact between the source electrode 114 and the drain electrode 115 first (not shown), then the source electrode 114 and the drain electrode 115 can be one or more combination of metallic materials or conductive metal oxides do not formed the ohmic contact with the $MoS_2$.

In summary, what the TFT array substrate and manufacturing method thereof of the present embodiment described is a back-gate electrode transistor, because of forming a semiconductor active layer 112 made by $MoS_2$ on a soft substrate 101 by transferring, the flexible display TFT array substrate 1 has the advantage of very high mechanical property and excellent flexural resistance, and using $MoS_2$ as the semiconductor active layer 112 can reduces the thickness of the substrate greatly and achieves transparent display. Further, the $MoS_2$ has band and without hanging keys, then using $MoS_2$ as a semiconductor electronic device can achieves stable operation and reducing the leakage current of the first gate electrode 111 at same time. Further, based on the FET electron mobility of the two-dimensional layered $MoS_2$ is higher than 200 $cm^2/v^{-1}\ s^{-1}$ and the switch current ratio higher than $10^8$, the large-area flexible display and the completely dark screen background in off state can be achieved.

Figure 6:
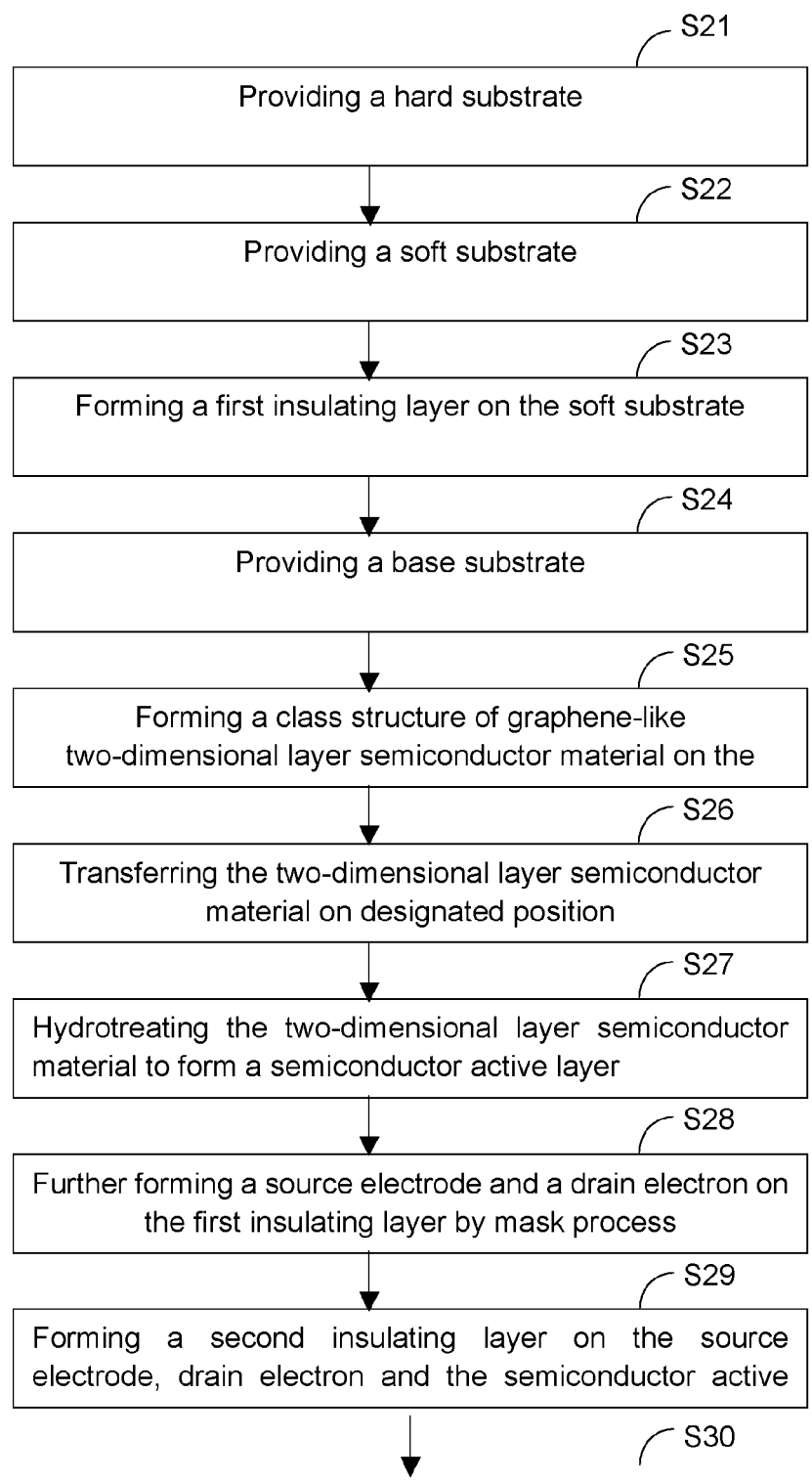
FIG. 6 is a schematic structural view of a TFT array substrate of the second embodiment of the present disclosure.

Further refer to FIG. 6, FIG. 6 is a schematic structural view of a TFT array substrate of the present disclosure second embodiment. Difference between the TFT array substrate 2 in FIG. 6 and the TFT array substrate 1 of the first embodiment in FIG. 1 is, the TFT array substrate 1 in FIG. 1 is a back-gate electrode transistor, the TFT array substrate 2 in FIG. 6 is a top-gate electrode transistor, structure of the top-gate electrode has the advantage of improving integration of FET unit area and can using lower voltage to operate switch of device.

As shown in FIG. 6, a TFT array substrate 2 of the present embodiment includes a hard substrate 100, a soft substrate 101 arranged on the hard substrate 100, a first insulating layer 113 arranged on the soft substrate 101, a semiconductor active layer 112 arranged on the default designated position of the first insulating layer 113, and the semiconductor active layer 112 is a class structure of graphene-like two-dimensional layered semiconductor material, the class structure of graphene-like two-dimensional layered semiconductor material is $MoS_2$, $MoSe_2$, $WS_2$, $WSe_2$ or $SnS_2$. A source electrode 114 and a drain electrode 115 are arranged on the first insulating layer 113, and the source electrode and the drain electrode are arranged at intervals on both sides of the semiconductor active layer 112 and contact the semiconductor active layer 112 respectively. A second insulating layer 116 is covered on the semiconductor active layer 112, the source electrode 114 and the drain electrode 115, the position of the second insulating 116 is corresponds to the position of the semiconductor active layer 112.

Please further reference to FIG. 7, the manufacturing method of the TFT array substrate of the present embodiment includes:

S21: providing a hard substrate 100.

S22: providing a soft substrate 101.

S23: a first insulating layer 113 is formed on the soft substrate 101.

S24: providing a base substrate.

S25: forming a class structure of graphene-like two-dimensional layered semiconductor material on the base substrate.

S26: transferring the two-dimensional layered semiconductor material on the designated position of the first insulating layer 113.

S27: hydrotreating the two-dimensional layered semiconductor material to form a semiconductor active layer 112.

S28: forming a source electrode 114 and a drain electrode 115 on the first insulating layer 113 by mask process.

S29: arranging a second insulating layer 116 on the source electrode 114, the drain electrode 115 and the semiconductor active layer 112.

S30: forming a second gate electrode 117 on the second insulating layer 116.

Further, difference of the production process between the TFT array substrate of the present embodiment and the array substrate of the above is, to ensure the device stability and the good contact of the soft display array substrate, the TFT array substrate of the present embodiment forms a first insulating layer 113 on the soft substrate 101 first, then transfers the class structure of graphene-like two-dimensional layered semiconductor material formed on the base substrate on the default designated position of the first insulating layer 113, further hydrotreating the class structure of graphene-like two-dimensional layered semiconductor material to form a semiconductor active layer 112, then a source electron 114 and a drain electron 115 are formed on the first insulating layer 113 by mask process, i.e. the source electron 114 and the drain electron 115 are formed on the both sides of the semiconductor active layer 112, the source electron 114 and the drain electron 115 are arranged at intervals by the semiconductor active layer 112, and the source electron 114 and the drain electron 115 contact the semiconductor active layer 112. The second insulating layer 116 and the second gate electrode 117 are covered on the semiconductor active 112, the source electron 114 and the drain electron 115, and the second gate electrode 117 is arranged on the second insulating layer 116 and is corresponds to the position of the semiconductor active layer 112.

In summary, region distinct from the prior art, the TFT array substrate of the present disclosure uses a class structure of graphene-like two-dimensional layered semiconductor material as a semiconductor active layer, thus the TFT array substrate has the advantage of higher electron mobility and mechanical property, excellent flexural resistance and reducing thickness of the substrate greatly.

Here we emphasize that the TFT array substrate of the present embodiment can be used in liquid crystal display (LCD), organic light-emitting diode (OLED), electrophoresis display (EPD), electro wetting display (EWP), etc., and the TFT can be the TFT in a pixel unit and the TFT be the TFT of the GOA circuit also.

The above are only embodiments of the present invention is not patented and therefore limit the scope of the present invention, any use of the contents of the present specification and drawings made equivalent or equivalent structural transformation process, either directly or indirectly, use the other relevant technical fields are included in the patent empathy scope of the invention.

What is claimed is:

1. A manufacturing method of a TFT array substrate, wherein the manufacturing method comprises:

providing a hard substrate;

providing a soft substrate, the soft substrate is arranged on the hard substrate;

a first insulating layer is formed on the soft substrate, wherein preset a designated position on the first insulating layer;

providing a base substrate;

a two-dimensional monolayer semiconductor material is formed on the base substrate, wherein the two-dimensional monolayer semiconductor material is $MoS_2$;

transferring the two-dimensional layered semiconductor material on the designated position;

hydrotreating the two-dimensional layered semiconductor material to form a semiconductor active layer;

wherein a thickness of the two-dimensional monolayer $MoS_2$ is 0.62 nm to 0.72 nm.

2. The manufacturing method according to claim 1, wherein specific steps of the two-dimensional monolayer semiconductor material forming on the base substrate comprises:

forming a Mo pattern on the base substrate, the position of the Mo pattern is corresponding to the designated location;

using $MoO_3$ and material S at a temperature between 600 to 800 to form a two-dimensional monolayer $MoS_2$ on the Mo pattern by chemical vapor deposition.

3. The manufacturing method according to claim 2, wherein a plane formed by the Mo atom in same layer of the two-dimensional monolayer $MoS_2$ is parallel with the soft substrate.

4. The manufacturing method according to claim 1, wherein after the step of providing a soft substrate and before the step of forming a first insulating layer on the soft substrate, further comprises:

a first gate electrode is formed on the soft substrate, wherein the first insulating layer covers the first gate electrode and protrudes on the soft substrate, and the position of the first gate electrode corresponds to the designated position.

5. The manufacturing method according to claim 4, wherein after the step of hydrotreating the two-dimensional monolayer semiconductor material to form a semiconductor active layer, further comprises:

Further formed a source electrode and a drain electrode on the first insulating layer by mask process, wherein the source electrode and the drain electrode are arranged at intervals by the semiconductor active layer, and the source electrode and the drain electrode contact the semiconductor active layer respectively.

6. The manufacturing method according to claim 1, wherein after the step of hydrotreating the two-dimensional monolayer semiconductor material to form a semiconductor active layer, further comprises:

Further formed a source electrode and a drain electrode on the first insulating layer by mask process, the source electrode and the drain electrode are arranged at intervals by the semiconductor active layer and the source electrode and the drain electrode contact the semiconductor active layer respectively;

arranging a second insulating layer on the source electrode, the drain electrode and the semiconductor active layer;

forming a second gate electrode on the second insulating layer, wherein the position of the second gate electrode corresponds to the position of the semiconductor active layer.

7. A TFT array substrate, wherein the array substrate comprises:

a hard substrate;

a soft substrate, the soft substrate is arranged on the hard substrate;

a first insulating layer, the first insulating layer is arranged on the soft substrate;

a semiconductor active layer, the semiconductor active layer is arranged on a pre-specified location of the first insulating layer, and the semiconductor active layer is a two-dimensional monolayer semiconductor material with a thickness of 0.62 nm to 0.72 nm, wherein the two-dimensional monolayer semiconductor material is $MoS_2$.

8. The array substrate according to claim 7, wherein the array substrate further comprises:

a first gate electrode, the first gate electrode is arranged between the soft substrate and the first insulating layer, and the first gate electrode corresponds to the semiconductor active layer;

a source electrode and a drain electrode, the source electrode and the drain electrode are arranged at intervals on the first insulating layer by the semiconductor active layer, and the source electrode and the drain electrode contact the semiconductor active layer respectively.

9. The array substrate according to claim 7, wherein the array substrate further comprises:

a source electrode and a drain electrode, the source electrode and the drain electrode are arranged at intervals on the first insulating layer by the semiconductor active layer, and the source electrode and the drain electrode contact the semiconductor active layer respectively;

a second insulating layer, the second insulating layer covers on the semiconductor active layer, the source electrode and the drain electrode;

a second gate electrode, the second gate electrode is arranged on the second insulating layer, and the position of the second gate electrode corresponds to the position of the semiconductor active layer.

* * * * *